United States Patent [19]
Matsuda et al.

[11] Patent Number: 5,917,228
[45] Date of Patent: Jun. 29, 1999

[54] TRENCH-TYPE SCHOTTKY-BARRIER DIODE

[75] Inventors: Noboru Matsuda, Kawasaki; Yoshiro Baba, Yokohama, both of Japan

[73] Assignee: Kabushiki Kaisha Toshiba, Kawasaki, Japan

[21] Appl. No.: 08/800,028

[22] Filed: Feb. 13, 1997

[30] Foreign Application Priority Data

Feb. 21, 1996 [JP] Japan .................................. 8-033716

[51] Int. Cl.$^6$ ........................ H01L 29/861; H01L 31/107
[52] U.S. Cl. ..................... 257/453; 257/457; 257/471; 257/483; 257/484
[58] Field of Search .................................. 257/485, 486, 257/471, 476, 453, 457, 456, 472, 473, 483, 484

[56] References Cited

U.S. PATENT DOCUMENTS 3,846,192 11/1974 Murrmann ............................ 257/478
4,675,468 6/1987 Basol et al. .......................... 136/256
5,017,976 5/1991 Sugita ................................... 257/484
5,612,568 3/1997 Arai ..................................... 257/481

*Primary Examiner*—William Mintel
*Attorney, Agent, or Firm*—Finnegan, Henderson, Farabow, Garrett & Dunner, L.L.P.

[57] ABSTRACT

The present invention relates to a schottky-barrier diode capable of decreasing a leakage current due to damage generated on inner walls of trenches, and securing a large operation region for itself. In the device, an N$^-$-type epitaxial layer is formed on a N$^+$-type silicon substrate. In a predetermined region in the epitaxial layer, a P$^+$-type base diffusion layer having high impurity concentration is formed. Trenches are formed through from the surface of the base diffusion layer to the epitaxial layer. In each of the trenches, an N$^-$-type selective epitaxial growth region is formed. A schottky metal is formed on a surface comprising the surfaces of the base diffusion layer, which includes the selective epitaxial growth regions, and the epitaxial layer. Surface regions as the surfaces of the selective epitaxial growth regions filling the trenches function as diode operation regions.

13 Claims, 2 Drawing Sheets

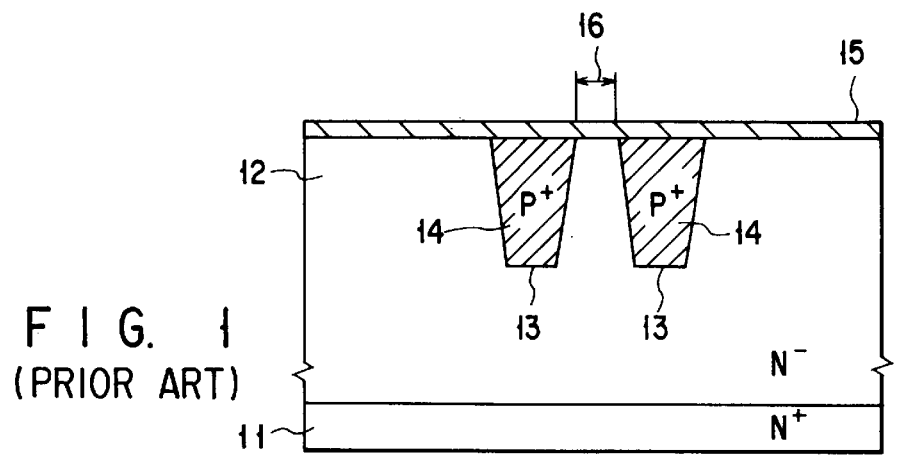
FIG. 1 (PRIOR ART)
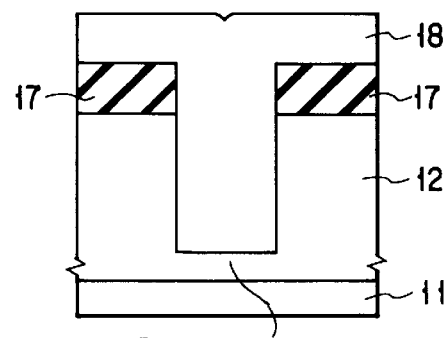
FIG. 2A
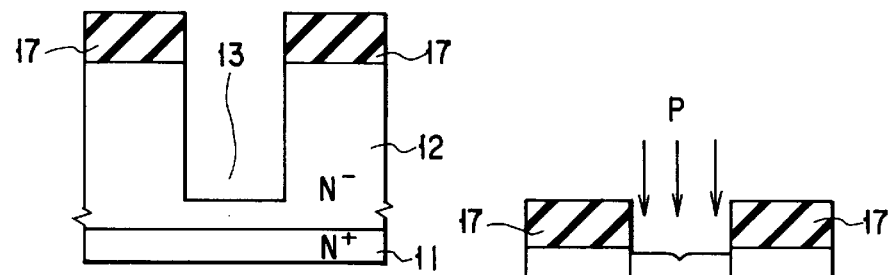
FIG. 2B
FIG. 2D
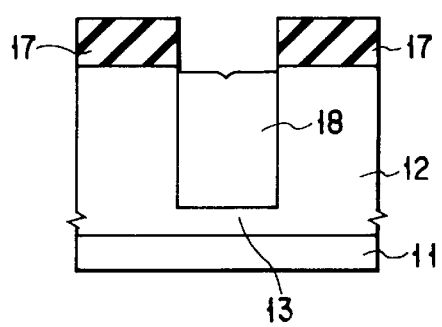
FIG. 2C
FIG. 2E

TRENCH-TYPE SCHOTTKY-BARRIER DIODE

BACKGROUND OF THE INVENTION

This invention relates to a semiconductor device, more particularly, a trench-type schottky-barrier diode (SBD), a method of manufacturing the device.

FIG. 1 is a sectional view showing the conventional trench-type schottky-barrier diode (SBD). As shown in FIG. 1, an N$^+$-type epitaxial layer 12 is formed on a surface of an N$^+$-type silicon substrate 11, and trenches 13 are formed in the N$^+$-type epitaxial layer 12. A P$^+$-type polysilicon layer 14 with high impurity concentration is formed, filling the trenches 13. On the surface of the epitaxial layer 12, a schottky metal 15 (anode electrode) is formed to cover the polysilicon layer 14. Provided on the other surface of the substrate 11 is an ohmic electrode (cathode electrode, not shown). A surface region 16 of the schottky metal 15 on the epitaxial layer 12 which is located between two polysilicon layers 14, functions as a diode operation region.

FIGS. 2A–2E are sectional views presented to serially show the manufacturing process of the conventional trench-type SBD shown in FIG. 1, i.e., from the step of forming the trenches to a step of forming the schottky metal. The reference numerals similar to those used in FIG. 1 designate like portions, for simplicity of illustration.

As shown in FIG. 2A, a CVD oxide film 17 about 400 nm thick is formed on the epitaxial layer 12 provided on the substrate 11 by the CVD (chemical vapor deposition). Using the subsequently patterned CVD oxide film as a mask, the trench 13 having an opening less than 2 μm in width and depth is formed in the epitaxial layer 12 by means of the RIE (reactive ion etching). Then, the process for minimizing the damage to the side walls of the trench 13 (e.g. the process such as the wet etching with use of alkaline liquid) is performed. Next, an undoped polysilicon layer 18 of 800–1000 nm thick is formed by the CVD, filling the trench 13 as shown in FIG. 2B. FIG. 2C shows next that the undoped polysilicon layer 18 is etched back by the RIE to the same level as the surface of the epitaxial layer 12. Then, as shown in FIG. 2D, p-type impurity (boron) is doped into the undoped polysilicon layer 18 in the trench by use of the CVD oxide film mask used also in the trench forming step. Next, the device is subjected to a heating step, thereby the impurity doped into the undoped polysilicon layer 18 is diffused, as shown in FIG. 2E. By diffusing the impurity in this manner, a p-type polysilicon layer 14 is formed in the trench 13. Subsequently, a schottky metal 15 is formed by the sputtering, on the surfaces of the epitaxial layer 12 and the undoped polysilicon layer 14.

The above-mentioned structure, however, has some problems as described below. First, the undoped polysilicon layer 18 deposited in the trench by the CVD may damage the inner walls of the trench. The undoped polysilicon layer 18 is formed by the CVD and is inevitably rough-grained. Prior to the deposition of the undoped polysilicon layer, the epitaxial layer 12 forming the inner walls of the trench is considerably influenced by the RIE step for forming the trench 13. The influenced epitaxial layer is exposed to the deposition of such a rough-grained polysilicon layer, the interface between the epitaxial (i.e., the single crystalline) silicon and the deposited polysilicon will be inevitably affected adversely. This is the main cause of an increase in a leakage current generated during the operation of the device.

Secondly, a structural problem may arise. The smaller the device, the more difficult to secure a large operation region. As is clear from FIG. 1, when the diode operation region is desired to be formed to have a large area in a limited area having the trench, the width of the opening of the trench 13 is necessarily to be decreased. However, the trench opening cannot be decreased to be less than a specific limit. Therefore, the device cannot be made smaller without decreasing the operation region.

Thirdly, a problem exists also in the manufacturing process. The etch-back step of the undoped polysilicon layer 18 has to be controlled with considerably much care, otherwise the reliability of the device will decrease thereby. FIG. 2C shows that the polysilicon layer 18 is etched back to the level very near the surface of the epitaxial layer 12. However, the etch-back level can hardly be controlled well in such a manner. If the etch-back step ends in the condition where the level of the polysilicon layer 18 is extremely higher/lower than that of the epitaxial layer 12, some gaps may occur in the schottky metal 15 formed in the subsequent step.

As described above, in the conventional trench-type schottky-barrier diode, the leakage current generated due to the damage of the inner wall of the trench inevitably increase, and a large area of the operation region cannot be secured. Further, in order to attain high reliability, the manufacturing process has to be improved.

BRIEF SUMMARY OF THE INVENTION

The object of the present invention is thus to provide a semiconductor device which can attain a decrease in the leakage current and an increase in the diode operation region area and which can therefore be made small. To achieve the object of the present invention, there is provided a schottky-barrier diode comprising:
a semiconductor layer having a first conductivity type;
a semiconductor region having a second conductivity type; a trench region formed extending from a surface of the semiconductor region to the semiconductor layer and filled with an epitaxial layer having the first conductivity type; and a metal electrode contacting the surface of the epitaxial layer.

According to the present invention, the epitaxial layer fills the trench region. The damage to the inner walls of the trench is far less than in comparing with the conventional device. Since the trench region is filled with the epitaxial layer, virtually no leakage current due to the damage of the inner walls of the trench is generated. Further, the epitaxial layer in the trench region has the first conduction type like the semiconductor layer. The diode operation region is therefore formed on the trench region so as to have the same width as that of the trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing the conventional trench-type SBD.

FIGS. 2A–2E are sectional views presented to serially show the forming process of the conventional trench-type SBD shown in FIG. 1, i.e., from the trench forming step to the schottky metal forming step.

DETAILED DESCRIPTION OF THE INVENTION

Figure 3:
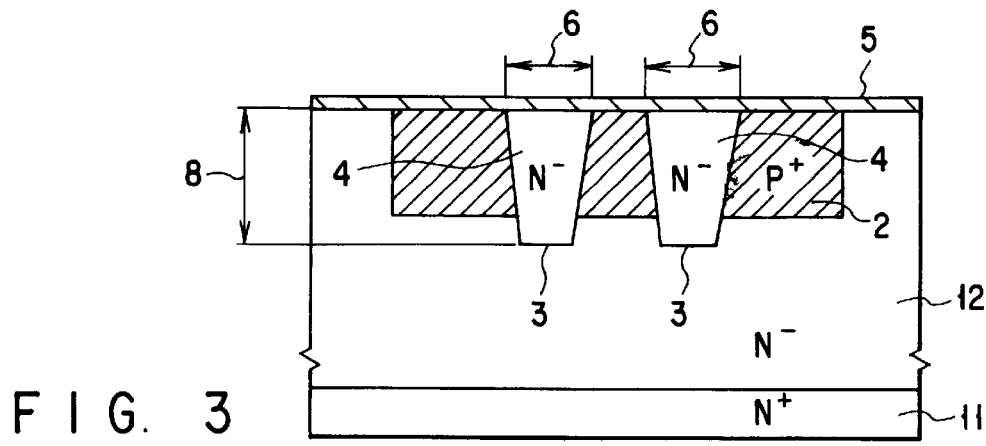
FIG. 3 is a sectional view showing the trench-type SBD according to the first embodiment of the present invention.

FIG. 3 is a sectional view showing the trench-type SBD according to the first embodiment of the present invention. In the drawing, an $N^-$-type epitaxial layer 12 is formed on an $N^+$-type silicon substrate 11. In a predetermined region in the epitaxial layer 12, a $P^+$-type base diffusion layer 2 having high impurity concentration is formed. Trenches 3 are formed to pass through from the surface of the base diffusion layer 2 to the epitaxial layer 12. In each of the trenches 3, an $N^-$-type selective epitaxial growth region 4 is deposited. A schottky metal 5 (anode) is formed on a surface comprising the surfaces of the base diffusion layer 2, the epitaxial layer 12, and the selective epitaxial growth regions 4. Another surface of the substrate 11, on which the epitaxial layer 12 is not formed, is provided with an ohmic electrode (cathode, not shown). Surface regions 6 as the surfaces of the selective epitaxial growth regions 4 filling the trenches 3 function as diode operation regions.

FIGS. 4A–4D are sectional views presented to serially show the forming process of the trench-type SBD of the present invention shown in FIG. 3, i.e., from the trench forming step to the schottky metal forming step. The reference numerals similar to those used in FIG. 3 are used to designate like portions, for simplicity of illustration.

Figure 4A:
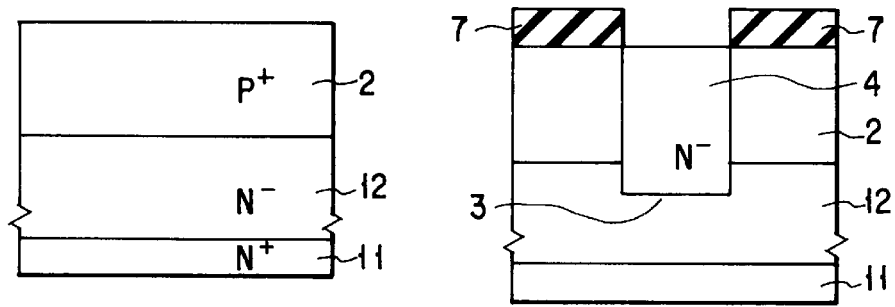
FIGS. 4A–4D are sectional views presented to serially show the forming process of the trench-type SBD of the present invention shown in FIG. 3, i.e., from the trench forming step to the schottky metal forming step.
Figure 4C:
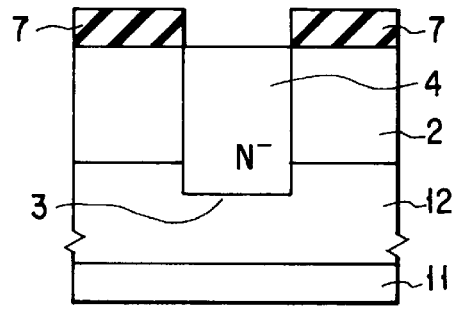
Figure 4B:
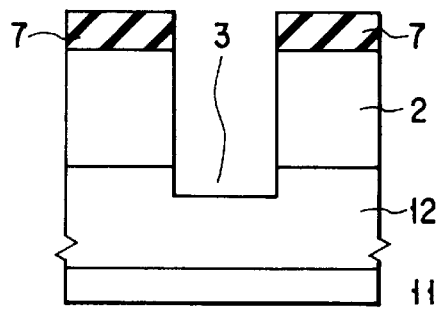
Figure 4D:
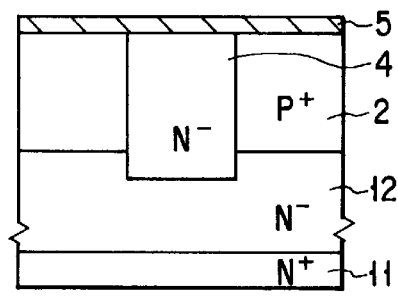

As shown in FIG. 4A, the base diffusion layer 2 having the thickness of 0.5–1.5 $\mu$m is formed on the epitaxial layer 12 on the $N^+$-type silicon substrate 11. The base diffusion layer 2 is formed by selectively implanting ions of the $P^+$-type impurity (e.g. boron) having high concentration into trench forming regions which will be described later. The concentration of the impurity is set at a range around $1 \times 10^{18}/cm^{-3}$. Next, as shown in FIG. 4B, a CVD oxide film 7 having a thickness of 400 nm is formed to be deposited on the base diffusion layer 2 by the CVD, and then patterned. With use of the patterned CVD oxide film 7 as a mask, trench 3 having an opening the width and depth of which are less than 2 $\mu$m are formed in accordance with the anisotropic RIE. The trenches are formed to pass through at least the base diffusion layer 2. Then, the process for minimizing the damage to the side walls of the trench 3, e.g. the process such as the wet etching with use of alkaline liquid, is performed. Next, a $N^-$-type epitaxial layer (selective epitaxial growth region) 4 having impurity concentration of $1 \times 10^{17}$–$10^{19}/cm^{-3}$ is formed on the bottom surface of the trench 3 (the exposed surface of the epitaxial layers 12 in the trench 3) by performing the selective epitaxial growth on the bottom surface of the trench with use of the remaining CVD oxide film as a mask. By forming the epitaxial layer 4 in this manner, the epitaxial layer 4 is deposited up to the brims of the trench 3, i.e., the same level of the surface of the base diffusion layer 2, surrounding the trench 3 so as to fill the trench. Next, as shown in FIG. 4D, the CVD oxide film 7 is removed, and a schottky metal 5 is formed by the sputtering on a silicon surface comprising the surfaces of the base-diffusion layer 2 and the selective epitaxial growth region 4.

According to the above-mentioned method, the trench 3 formed to pass through the base diffusion layer and the epitaxial layer are filled with the selective epitaxial growth region 4. Therefore, the damage to the inner wall of the trenches can be remarkably suppressed, in comparing with the conventional method wherein the material different from that of the trench, i.e., polysilicon is deposited in the trench formed in the epitaxial layer. As a result, the leakage current due to the damage can be notably decreased.

Further, the surface regions 6 as the surface of each of the selective epitaxial growth regions 4 filling the trenches 3, which contact the schottky metal 5, function as the diode operation regions. In other words, the width of each of the surface regions 6 is the width of the diode operation regions. By forming the diode operation regions in this manner, the device can be further decreased in size, with increasing the diode operation regions, in comparing with the conventional case wherein the diode operation region is formed between the trenches. In this structure, the width of the surface regions 6 as the diode operation regions on the trenches 3 is set less than 2 $\mu$m in order to decrease the entire device in size.

Additionally, the selective epitaxial growth region 4 is formed to fill only the trenches in a self-aligned manner. By forming the selective epitaxial growth region 4 in this manner, the etch-back step which cannot be performed with ease and thus has been a problem for the SBD manufacturing method can be skipped. As a result, the difficulty in the manufacturing process is solved, and thus the reliability of the device can be improved.

Further, the trenches 3 are formed by the RIE, and thus the upper portion of the trenches 3, which contact the schottky metal 5, are larger in width than the lower portions of the trenches 3, which contact the epitaxial layer. The operation regions of the SBDs of the present invention are each located within the width of the trench, and thus formed larger in comparing with the conventional device. In this structure, the electric field generated on the interface between the SBDs is weakened by the pinch-off condition generated by the depletion layers extending from the PN junction formed on the inner walls of the trenches, and thus the leakage current $I_R$ can be decreased also by this structure.

When the trenches are formed too deeply, the capacitances of the epitaxial growth regions 4 increases, and the pinch-off condition may not be obtained. If the pinch-off condition cannot be obtained, the above-mentioned effect will not be obtained. In order to prevent this, the depths of the trenches (shown by the reference number 8 in FIG. 3) are determined as less than 2 $\mu$m. If the trenches are desired to have more small depth, the trench depth may be decreased to be substantially the same as that of the base diffusion region 2, though the trenches 3 need to be formed to reach the bottom of the base diffusion region 2, at least.

Figure 5:
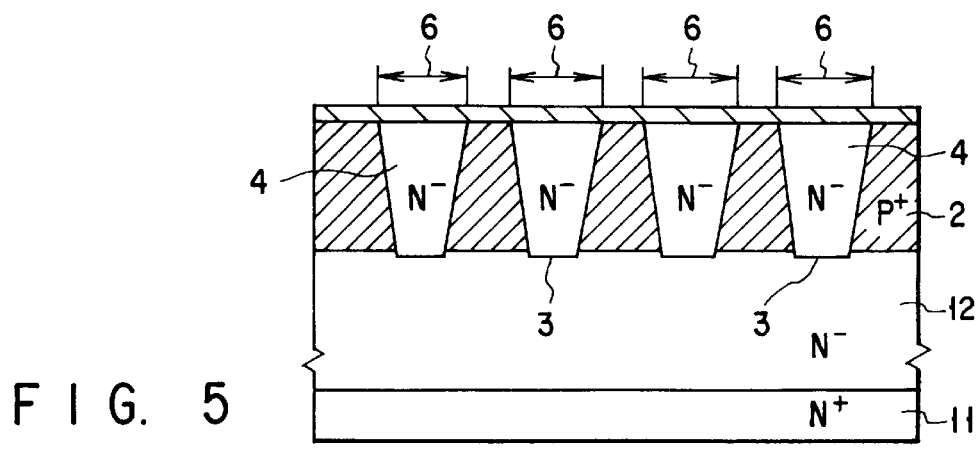
FIG. 5 is a sectional view showing the trench-type SBD according to the second embodiment of the present invention.

FIG. 5 is a sectional view showing the trench-type SBD according to the second embodiment of the present invention. In this embodiment, more trenches 3 than shown in FIG. 3 are arranged in the device. As should be clear from this structure, more operation regions than the device shown in FIG. 3 can be obtained in a limited area covering the openings of the trenches.

In the above-mentioned structures, the SBD element is formed by using silicon as a substrate and silicon epitaxial layer as a base diffusion layer, but can be formed with a gallium arsenide substrate and a gallium arsenide epitaxial layer. As the schottky metal as an electrode, various metal can be used, such as nickel, moribden, titan, and gold. The alloy or multilayered electrode may be also used.

As described above, the present invention can provide the semiconductor device wherein the trenches is filled with the epitaxial layer to form the operation region within the width of the trench, thereby remarkable decrease of the damage to the inner walls of the trenches, decrease of the leakage current due to the damage, and increase of the diode operation region can be obtained, and thus is capable of decreasing the whole size of the device without decreasing the diode operation region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A schottky-barrier diode comprising:
   a semiconductor layer having a first conductivity type;
   a semiconductor region formed in the semiconductor layer, the semiconductor region having a second conductivity type;
   a trench region formed to pass through from a surface of the semiconductor region to the semiconductor layer and filled with an epitaxial layer having the first conductivity type; and
   a metal electrode contacting the surface of the epitaxial layer.

2. The schottky-barrier diode according to claim 1, further comprising a semiconductor substrate having the first conductivity type, the semiconductor substrate being formed under the semiconductor layer so as to contact with an ohmic contact electrode,
   wherein the semiconductor layer is an epitaxial layer of the semiconductor substrate.

3. The schottky-barrier diode according to claim 1, wherein an upper portion of the trench region, which contacts the metal electrode, is larger in width than a lower portion of the trench region, which contacts the semiconductor layer.

4. The schottky-barrier diode according to claim 1, wherein an upper portion of the trench region, which contacts the metal electrode, is larger in width than a lower portion of the trench region, which contacts the semiconductor layer, and a width of the upper portion of trench region is less than 2 $\mu$m.

5. The schottky-barrier diode according to claim 1, wherein the trench region is formed to have the substantially the same depth as thickness of the semiconductor region.

6. The schottky-barrier diode according to claim 1, wherein the trench region and the semiconductor region are formed to have a depth of 2 $\mu$m from the surface of the semiconductor region.

7. The schottky-barrier diode according to any one of claims 1 to 6, wherein a plurality of the trench region are arranged such that openings thereof are arranged at predetermined intervals on a surface of the semiconductor region.

8. A schottky-barrier diode comprising:
   a semiconductor layer having a first conductivity type;
   a semiconductor region formed in the semiconductor layer, the semiconductor region having a second conductivity type;
   a plurality of trench regions formed to pass through from a surface of the semiconductor region to the semiconductor layer, the trench regions being arranged such that openings thereof are located at predetermined intervals on the surface of the semiconductor region, each of the trench regions filled with an epitaxial layer having the first conductivity type; and
   a metal electrode contacting the surface of the epitaxial layer.

9. The schottky-barrier diode according to claim 8, further comprising a semiconductor substrate having the first conductivity type, the semiconductor substrate being formed under the semiconductor layer,
   wherein the semiconductor layer is an epitaxial layer of the semiconductor substrate.

10. The schottky-barrier diode according to claim 8, wherein an upper portion of each of the trench regions, which contact the metal electrode, are larger in width than a lower portion of each of the trench regions, which contact the semiconductor layer.

11. The schottky-barrier diode according to claim 8, wherein an upper portion of each of the trench regions, which contacts the metal electrode, is larger in width than a lower portion of each of the trench regions, which contacts the semiconductor layer, and a width of each of the trench regions is less than 2 $\mu$m.

12. The schottky-barrier diode according to claim 8, wherein the trench regions are formed to have the substantially the same depth as thickness of the semiconductor region.

13. The schottky-barrier diode according to claim 8, wherein the trench regions and the semiconductor region are formed to have a depth of 2 $\mu$m from the surface of the semiconductor region.

* * * * *